United States Patent [19]

Campbell et al.

[11] Patent Number: 4,545,327
[45] Date of Patent: Oct. 8, 1985

[54] CHEMICAL VAPOR DEPOSITION APPARATUS

[75] Inventors: Bryant A. Campbell, Los Gatos; Nicholas E. Miller, Cupertino, both of Calif.

[73] Assignee: Anicon, Inc., San Jose, Calif.

[21] Appl. No.: 412,237

[22] Filed: Aug. 27, 1982

[51] Int. Cl.$^4$ .............................................. C23C 13/08
[52] U.S. Cl. ..................... 118/719; 118/724; 118/725; 118/733; 118/728
[58] Field of Search ............... 118/725, 641, 719, 733, 118/620, 724, 728, 715; 156/613

[56] References Cited

U.S. PATENT DOCUMENTS

| | | | |
|---|---|---|---|
| 3,293,074 | 12/1966 | Nickl | 156/613 X |
| 3,456,616 | 7/1969 | Gleim et al. | 118/725 |
| 3,704,987 | 12/1972 | Arndt et al. | 118/725 X |
| 3,830,194 | 8/1974 | Benzing et al. | 118/715 |
| 4,098,923 | 7/1978 | Alberti et al. | 118/500 X |
| 4,309,240 | 1/1982 | Zaferes | 156/613 |
| 4,348,580 | 9/1982 | Drexel | 118/50.1 |

Primary Examiner—Norman Morgenstern
Assistant Examiner—Bernard F. Plantz
Attorney, Agent, or Firm—William B. Walker

[57] ABSTRACT

A chemical vapor deposition device having uniformly distributed heating means substantially surrounding an inner deposition reaction chamber for providing isothermal or precisely controlled gradient temperature conditions therein, the reaction chamber being surrounded by the walls of an outer vacuum chamber spaced therefrom.

11 Claims, 8 Drawing Figures

CHEMICAL VAPOR DEPOSITION APPARATUS

FIELD OF THE INVENTION

This invention relates to a chemical vapor deposition apparatus and process. In particular, this invention relates to an apparatus and process for the chemical vapor deposition of highly uniform, uncontaminated coatings of selected elements and compounds on substrates.

BACKGROUND OF THE INVENTION

Chemical Vapor Deposition (CVD) is the process of depositing a solid material from a gaseous phase onto a substrate by means of a chemical reaction. The deposition reaction involved is generally thermal decomposition, chemical oxidation, or chemical reduction. In one example of thermal decomposition, organometallic compounds are transported to the subtrate surface as a vapor and are reduced to the elemental metal state on the substrate surface.

For chemical reduction, the reducing agent most usually employed is hydrogen, although metal vapors can also be used. The substrate can also act as a reductant as in the case of tungsten hexafluoride reduction by silicon. The substrate can also supply on element of a compound or alloy deposit. The CVD process can be used to deposit many elements and alloys as well as compounds including oxides, nitrides and carbides.

In the present invention, CVD technology can be used to manufacture deposits on substrates for a variety of purposes. Tungsten carbide and aluminum oxide wear coatings on cutting tools; corrosion resistant coatings of tantalum, boron nitride, silicon carbide and the like and tungsten coatings on steel to reduce erosion can be applied according to this invention. The apparatus and method is particularly advantageous in manufacturing solid state electronic devices and energy conversion devices.

Chemical vapor deposition of electronic materials is described by T. L. Chu et al, *J. Bac. Sci. Technol.* 10, 1 (1973) and B. E. Watts, *Thin Solid Films* 18, 1 (1973). They describe the formation and doping of epitaxial films of such materials as silicon, germanium and GaAs, for example. In the field of energy conversion, the CVD process provides materials for nuclear fission product retention, solar energy collection, and superconduction. A summary of the chemical vapor deposition field is provided by W. A. Bryant, "The Fundamentals of Chemical Vapour Deposition" in *Journal of Materials Science* 12, 1285 (1977), and is hereby incorporated by reference.

The deposition parameters of temperature, pressure, the ratio of reactant gases, and amount and distribution of gas flow critically determine the deposition rates and the ability of a particular system to provide the desired uniformity and quality of deposition. The limitations of prior art systems stem from their inability to adequately control one or more of these factors or from deposit contamination.

DESCRIPTION OF THE PRIOR ART

The reaction chambers employed for chemical vapor deposition are generally classified as cold wall or as hot wall systems. In cold wall systems, the substrate is heated by inductive coupling, radiant heating or direct electrical resistance heating of internal support elements. Hot wall systems rely on radiant heating elements arranged to create a heated reaction and deposition zone. Conduction and convection heating approaches have also been used in hot wall systems.

Cold wall systems for chemical vapor deposition are described in U.S. Pat. Nos. 3,594,227, 3,699,298, 3,704,987, and 4,263,872. In these systems, the semiconductor wafers are positioned inside a vacuum chamber, and induction coils are arranged exterior to the vacuum chamber. The wafers are mounted on a susceptable material adapted for heating by RF energy. By localizing heat to the immediate semiconductor wfer area, chemical vapor deposition is limited to the heated areas. Since the unheated walls are below CVD temperatures, deposition on the walls is reduced. The temperatures in the reaction zone are usually not as uniform as those obtained with hot wall systems.

U.S. Pat. Nos. 3,705,567 is directed to a system for doping semiconductor wafers with a doping compound. The chamber containing the wafers extends into the oven in a cantilever supported system. Heating elements are provided along the sides, and the temperatures of the centrally located wafers would vary substantially from those at the ends. Diffusion of vapor is perpendicular to the wafer orientation, and the wafers are not exposed to uniform concentrations of doping compound. The edge to center, wafer to wafer, and batch to batch uniformity required for advanced semiconductor devices such as VLSI (very large scale integration) devices can not be achieved with this system. This is a closed, vapor deposition system and does not provide for positive gas flow using a carrier gas.

Hot wall CVD systems currently used in making semiconductor materials are most commonly converted doping ovens. These have long tubular reactors of quartz or similar inert material, and heat is provided by heating elements coiled around the outside of the cylindrical portion. The reactor ends are not heated, and temperature variance is so severe that only a portion in the center of the deposition chamber (typically one-third of the heated total) is useful. Equilibrium temperature variations between parts of the limited reaction zone typically exceeds 4° C. The tube walls become coated, are difficult to remove and clean, and are a source of debris. The wafers are positioned in a boat which is cantilevered from beyond the end of the tubular reactor, the wafers being reloaded by full retraction of the cantilevered support from the chamber. The floor area occupied by a single converted doping oven and associated equipment (for a 30 inch effective reaction zone) is about 70 to 80 sq. feet. These converted ovens have severe limitations for use in manufacturing advanced integrated circuit components, frequently contaminating the semiconductor wafers and causing a high rejection rate. Sustaining power requirements are excessive, and the unit capacity is limited by the lengthy time required to reach thermal equilibrium. Prior to this invention, apparatus has not been available to manufacture the precision, high quality coatings desired by the semiconductor industry for the most advanced integrated circuit components such as VLSI devices. This is a consequence of the increased requirements for the uniform and homogeneous physical and electrical properties such as dielectric strength, resistivity and the like.

SUMMARY OF THE INVENTION

This invention is directed to a chemical vapor deposition device having radiant heat sources substantially surrounding an inner deposition reaction chamber and providing accurately controlled conditions therein.

The inner deposition reaction chamber can be an isothermal chamber or may have a precisely controlled temperature gradient, as predetermined by the operator. This inner deposition reaction chamber has a gas distribution system for introducing gas into the inner chamber and removing gas therefrom. A vacuum chamber encloses the inner deposition reaction chamber, and the vacuum chamber walls are spaced from the inner chamber walls. Preferably, the vacuum chamber has a domed housing, and the walls thereof are made of a material which is substantially transparent to radiation. The radiant heat sources are spaced over the outer surface of the domed housing and are positioned for controlled heating. Base radiant heat sources are also provided, and these can be provided either within the vacuum chamber or external thereto. In one embodiment, the vacuum chamber base has a domed configuration. By maintaining a gas pressure in the space surrounding the inner chamber more positive than that in the inner chamber, escape of gaseous components from the inner chamber is prevented, and contaminating deposits on the vacuum chamber walls are reduced.

The process of this invention for chemical vapor deposition of material on a substrate comprises passing a reactant gas in a single pass across a substrate surface in a flow direction substantially parallel to said surface. The substrate is positioned in a controlled temperature reaction zone having a deposition reaction temperature of from 250° to 1300° C. and a pressure of 750 torr, or less, the temperature difference at any point in the reaction zone being less than 2° C. from the desired uniform temperature or temperature gradient. The deposition gas is preferably removed after passing over the surface of a single substrate. In a preferred embodiment, the substrates such as semiconductor wafers are oriented so their surfaces are in a vertical plane, and the reactant gas is directed from a distributor vertically through the wafers to the gas collector. The controlled temperature conditions in the reaction chamber are obtained by heating it with radiant heat sources substantially surrounding the chamber. The reaction chamber walls are made from material which is substantially transparent to the radiation. Preferably, the reaction chamber is surrounded by a vacuum chamber spaced from the walls thereof, heating is provided by radiant heat sources substantially surrounding the walls of the vacuum chamber, and the vacuum chamber walls are made of a material substantially transparent to radiation.

It is an object of this invention to provide a truly controlled temperature chemical vapor deposition system (i.e., isothermal system or a CVD system with a precisely controlled temperature gradient) which provides a more uniform, contamination-free deposit on substrate surfaces. Further objects include providing a device which occupies a much smaller floor area per unit of substrate coating capacity, which provides a more efficient loading system for loading substrates into the reaction chamber, which reduces the time cycle from initial substrate loading to unloading, which provides for rapid removal of the inner reaction chamber components, and which has a power requirement per coated substrate substantially less than the prior art devices.

The terms "chemical vapor deposition" and "CVD", as used herein, are defined to include modifications of the process which increase or change the reactivity, chemical properties or chemical composition of the reactant gases while retaining the basic characteristics of chemical vapor deposition processes. Thus, processes such as plasma assisted chemical vapor deposition, uv excited (ultraviolet light excited) chemical vapor deposition, microwave excited chemical vapor deposition and the like in which reactant gas molecules are converted to more reactive entities are included within the meaning of these terms as used herein.

The term "radiant heat source(s)", as used herein, includes any device, system or means for heating whereby at least a part of the heat is transferred by radiation. It is recognized and intended that heat transfer by conduction and convection will also occur. The "radiant heat source" can be any material having an elevated temperature, without limitations as to how the temperature elevation was affected. Resistance heating elements and coatings, heat lamps, heated liquids and solutions, and microwave or induction heated materials can function as "radiant heat sources", for example.

The term "isothermal temperature conditions" as used herein is defined to mean temperature variations of less than 2 percent.

DETAILED DESCRIPTION OF THE INVENTION

Figure 1:
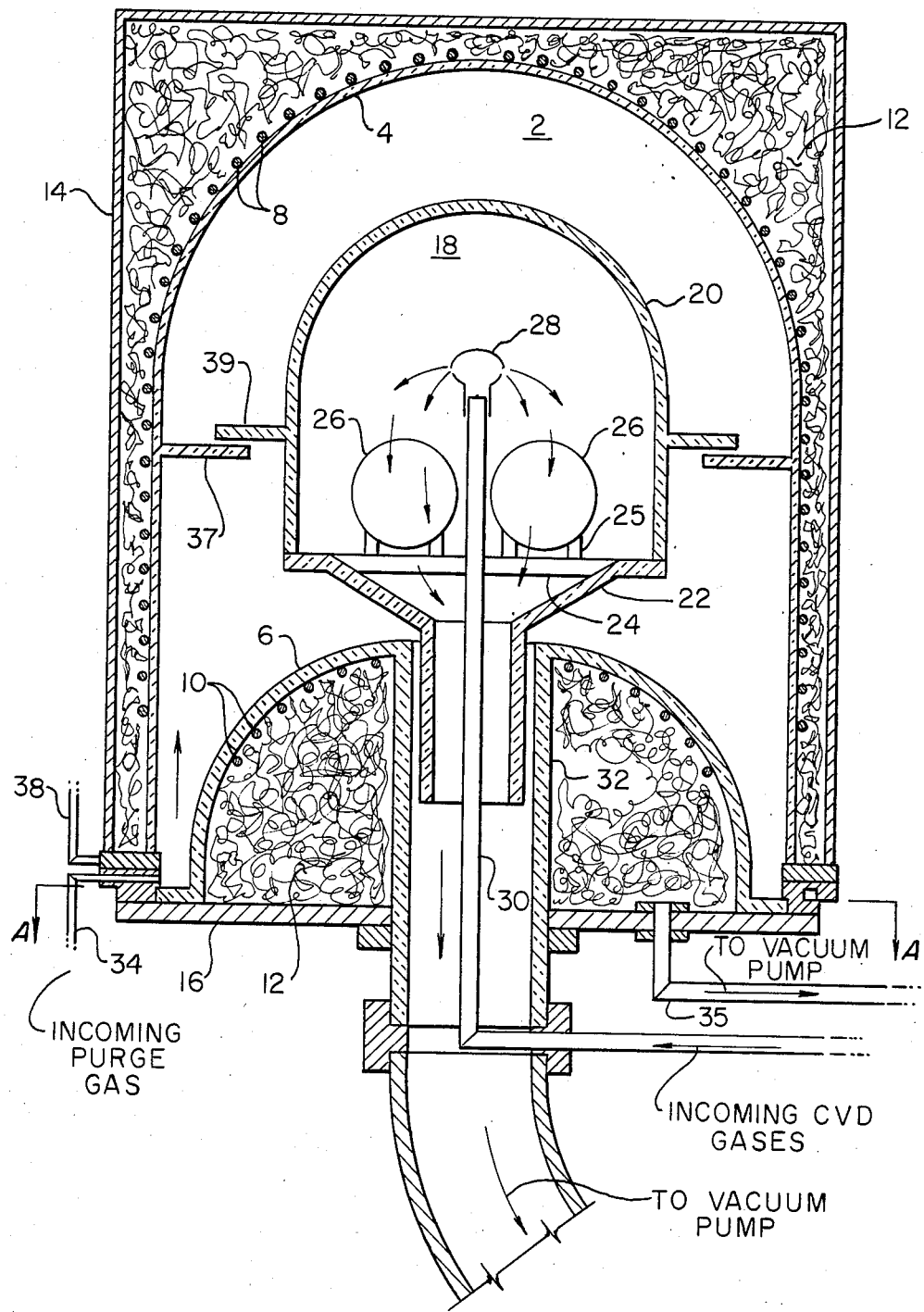
FIG. 1 is a cross-sectional view of the CVD device of this invention having a domed construction in both the upper housing and base.

Referring to FIG. 1, a cross-sectional view of an embodiment of the chemical vapor deposition device of this invention is shown. The vacuum chamber 2 is defined by the domed housing 4 and domed base 6. Resistance heating elements 8 are coiled around the cylindrical side walls and domed top of the housing 4, and resistance heating elements 10 are coiled on the exterior surface of the domed base 6. The spacing of the heating elements 8 and 10 are selected to provide controlled temperature conditions (isothermal conditions or controlled gradient conditions) within the reaction chamber 18. Insulating material 12 is positioned between the domed housing 4 and upper casing 14 and between the domed base 6 and the base casing 16.

The CVD reaction chamber 18 is defined by the domed reaction chamber wall 20 supported by the reaction chamber base or gas collector 22. Substrate support rods 24 are fused to or supported on the gas collector 22. Vertically oriented substrates (such as semiconductor wafers) 26 are supported on boats 25 resting on rods 24. The reactant gas distributor 28 supplied by conduit 30 distributes incoming reactant gases throughout the inner deposition reaction chamber 18. Conduit 30 and gas collector 22 pass through the gas system casing 32 which is a part of the domed base 6.

A purging gas inlet 34 is provided in the annular flange ring assembly 36 which holds the domed housing 4 and domed base 6 together in a sealed engagement. In order to prevent destruction of the seals by the elevated temperatures of chamber walls, the connecting flange ring assembly 36 is provided with circulating cooling fluid system having cooling fluid inlets 38 and cooling fluid outlets (not shown). The cooling fluid can be water or air, for example.

Vacuum conduit 35 can be used to reduce the gas pressure in the space between the domed base 6 and base plate 16 to relieve tension on the domed base 6, if desired. The inner wall surface of the vacuum chamber wall 4 has projections 37 which interact (engage) with corresponding lug projections 39 on the reaction chamber wall 20 to lift the reaction chamber wall 20 and expose the substrate loading zone when the upper assembly is removed for unloading and reloading.

Figure 2:
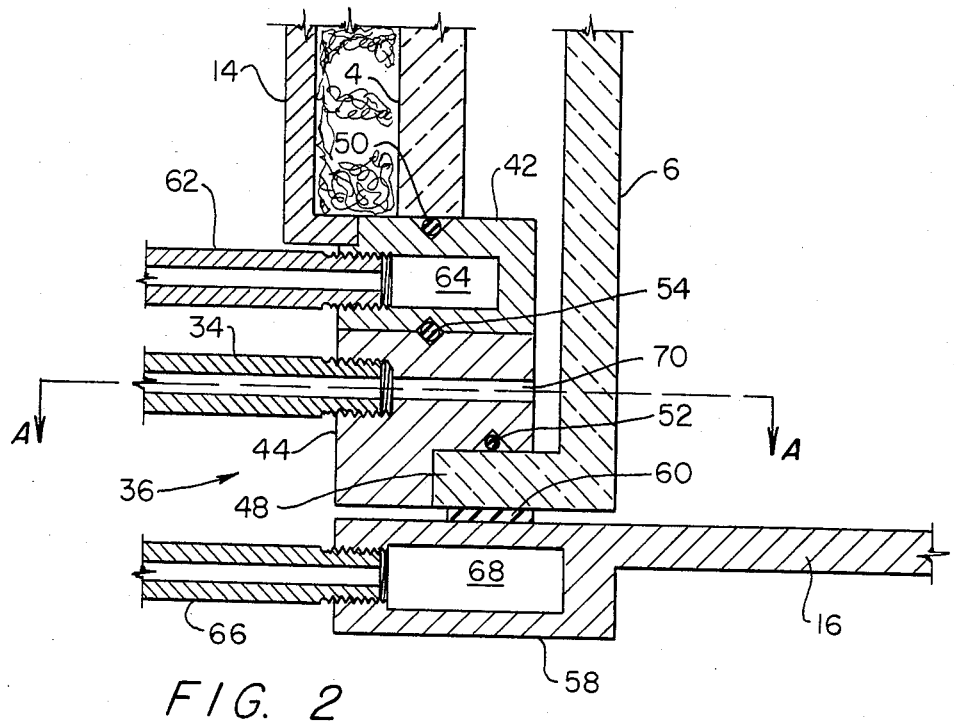
FIG. 2 is a partial, cross-sectional view of the detailed flange construction of the CVD device shown in FIG. 1.

Referring to FIG. 2, a partial, enlarged cross-sectional view of the flange area of the device in FIG. 1 is shown. The connecting flange ring assembly 36 includes an upper flange ring 42 which is in sealing engagement with the edge of the domed housing 4, the seal 50 providing a seal therebetween. Intermediate flange ring 44 is similarly in sealing engagement with the domed base flange 48, the seal 52 providing a sealed relationship therebetween. Seal 54 provides a seal between the upper flange ring 42 and intermediate flange ring 44. Lower flange ring 58 supports the domed base 40 flange 48, the gasket 60 providing a vacuum seal therebetween. Cooling fluid inlet 62 is provided in the upper flange ring 42 and supplies the coolant channel 64 with cooling fluid. Cooling fluid inlet 66 is provided in the lower flange ring 58 and supplies coolant to the coolant channel 68. The intermediate flange ring 44 also has the purging gas inlet passageway 70. The seals 50, 52 and 54 can be O-rings selected from polymeric materials which retain their physical properties at elevated temperatures. The gasket 60 can be of similar polymeric material. The seals can also be metal seals.

Figure 3:
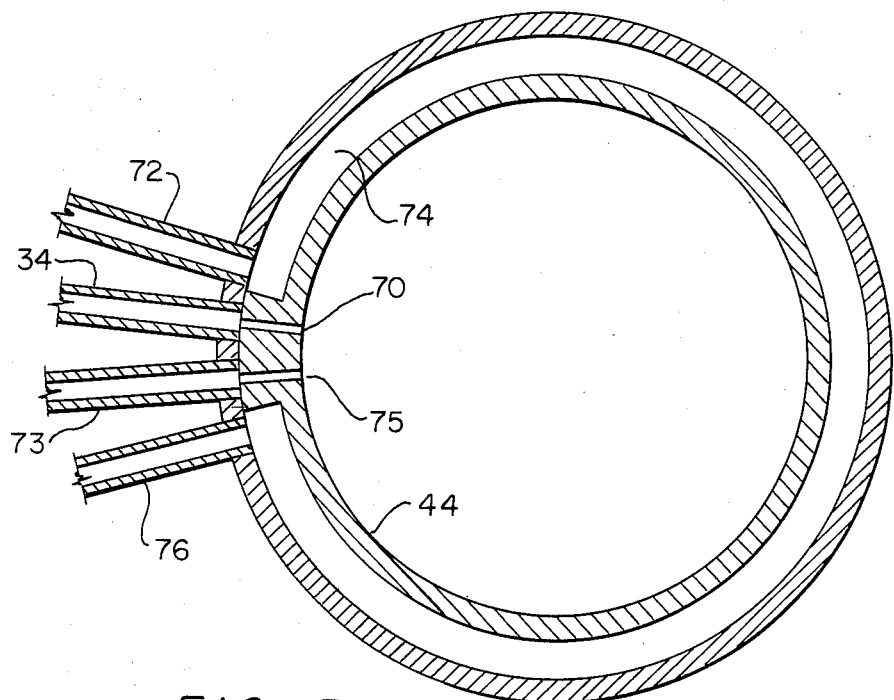
FIG. 3 is a cross-sectional view taken along lines A—A in FIGS. 1 and 2.

Referring to FIG. 3, a cross-sectional view of the intermediate flange ring taken along the lines A—A of FIGS. 1 and 2 is shown. This view shows the coolant circulation system. Cooling fluid inlet conduit 72 communicates with one end of channel 74, and cooling fluid outlet conduit 76 communicates with the other end of channel 74. Purging gas inlet passageway 70 is intermediate the ends of the coolant channel and is fed by purging gas inlet conduit 34. Vacuum conduit 73 communicates with vacuum exhaust passageway 75.

Deposit purity, absolute freedom from contamination and debris, and uniformity are critical requirements of the modern semiconductor industry. In general, all components of the CVD apparatus which can be possible sources of contamination must be selected from materials which are non-contaminating. In addition, certain components in the CVD device of this invention are preferably made of material which is substantially transparent to radiation to rapidly obtain controlled temperature conditions and efficient power usage. Therefore, referring to FIGS. 1 and 2, the domed housing 4, domed base 6, domed reaction chamber 20, substrate support 24, boats 25, reactant gas conduit 30 and gas system casing 32 are preferably composed of high purity quartz glass or of silicon. Silicon is useful in both polycrystalline and single crystal form. Any metal exposed to the vacuum chamber, for example, flange 42 should be an inert stainless steel such as 316 stainless steel.

In a typical operating cycle, the system has been preheated to the desired operating temperature, usually from 250° to 1300° C. The heating elements 8 and 10 when energized provide radiation which passes through the quartz walls of the domed housing 4, domed base 6 including casing 32, gas collector 22 and the reaction chamber walls 20. This rapidly raises the temperature to the desired operating level. The upper components of the device, the domed housing 4 and the associated heating elements 8, insulating material 12 and outer casing 14 form a single unit which, when lifted, engage with lugs 39, raising the inner deposition reaction chamber wall 20 and exposing the substrate loading zone. The inner deposition chamber 18 is then loaded with vertically oriented substrates 26 mounted in boats 25. The upper components of the device are then lowered to the operating position. A vacuum is drawn, and the combination of weight and air pressure forces the components together, compressing the seals and gasket and effecting a vacuum seal. The pressure within the vacuum chamber 2 is reduced to less than 0.00005 torr by exhausting gas through gas collector 22. When the temperature has again reached equilibrium at the desired value, reactant gases are introduced through gas conduit 30 and distributor 28. The gases are directed, under positive pressure, between the parallel substrate surfaces to the collector 22, thereby making a single pass by the substrate surfaces in a path parallel to the surfaces. Depletion of reactants in the reactant gases is thereby limited to what occurs in a single pass. This provides a greater uniformity and control of the coating deposited. The exhaust gas collector 32 is connected with a conventional vacuum pump and scrubbing system (not shown). Any suitable scrubbing system capable of removing the reactant gas components and reaction products from the carrier gas can be used, and any suitable vacuum pump and associated equipment can be used. Examples of gas compositions, temperatures and other conditions required for particular coatings are described in W. Brown et al, *Solid State Technology*, pp 51-57, 84 (July, 1979) and W. Kern et al, *J. Vac. Sci. Technol.*, 14, 5 (1977), which is hereby incorporated by reference.

Examples of medium temperature processing conditions are shown in the following table.

TABLE

| Film type | Pressure, torr | Temp., °C. | Reactant Gas Flow Rates (cc/min) | | | |
|---|---|---|---|---|---|---|
| | | | $SiH_4$ | $SiH_2Cl_2$ | $NO_2$ | $NH_3$ |
| Polysilicon | 0.22 | 625 | 53 | | | |
| $Si_3N_4$ | 0.32 | 800 | | 27 | | 93 |
| $SiO_2$ | 0.39 | 925 | | 56 | 113 | |

The above conditions are presented by way of example and not as a limitation.

The purging gas introduced through inlet 34 is a gas which is compatable with the reactant gases and can be the carrier gas, for example. The gas pressure within the vacuum chamber 2 exterior to the reaction chamber 18 is slightly higher than the pressure in chamber 18. This prevents the escape of reactant gas from the reaction chamber 18 into the portions of the vacuum chamber external thereto. This is critically important because in this system, the inner surface of the domed housing 4 and dome base 6 can be at the same temperature as the wafers and would support a deposition reaction. The resulting deposits would introduce debris, absorb water vapor during reloading, and by reducing transparency of the walls to radiation (when the deposited material is opaque to radiation), could reduce heating efficiency. In the system of this invention deposition is therefore limited to the substrate and the components exposed to the reaction chamber such as the reaction chamber wall 20, gas collector 22 with substrate support 24, and the boats 25. Fouled components can be quickly replaced with clean components, and the fouled components can be cleaned for reuse without interrupting the operation of the system. Therefore, it is a critical aspect of the invention that the inner reaction chamber components be constructed for easy disassembly and removal for cleaning.

Figure 4:
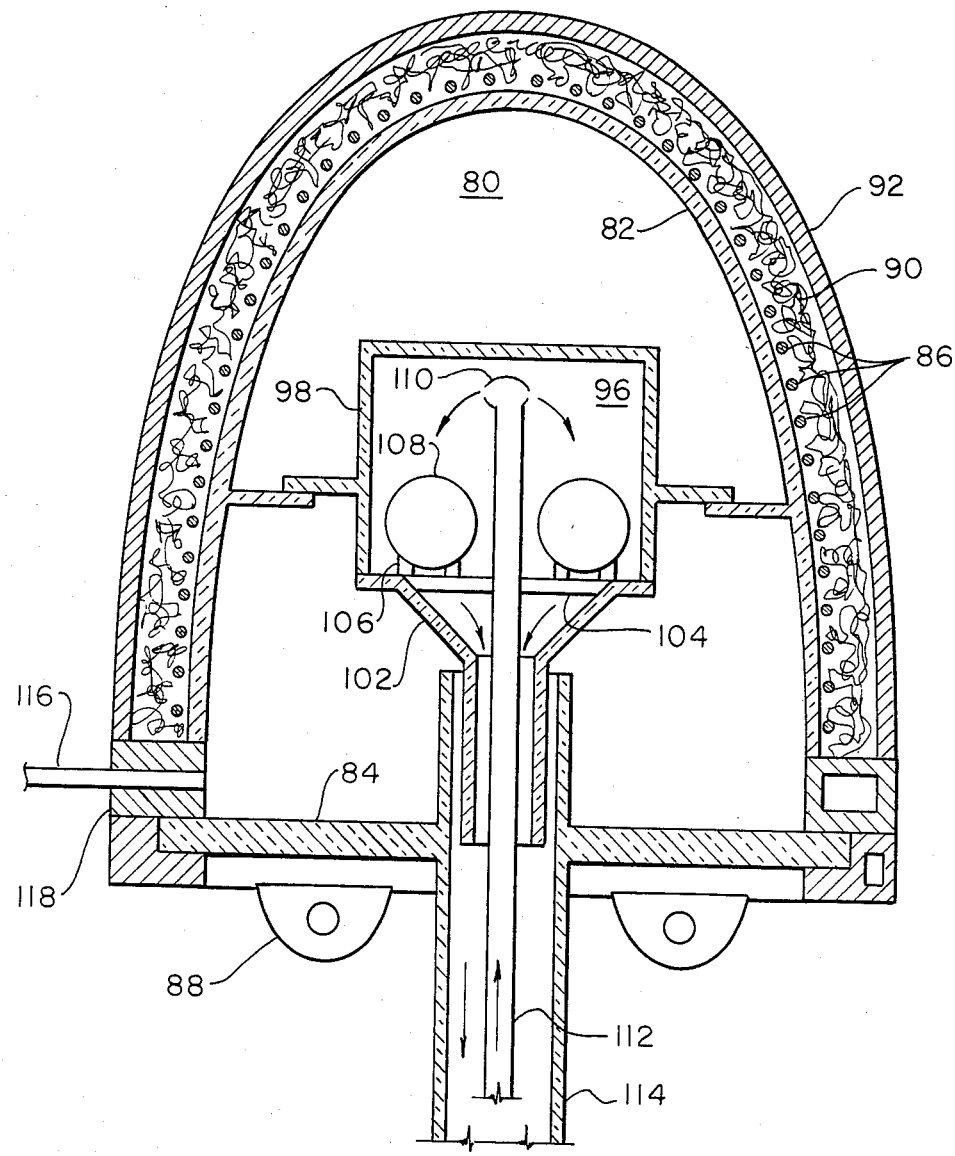
FIG. 4 is a cross-sectional view of another embodiment of the CVD device of this invention having a domed upper housing and a flat base construction.

Referring to FIG. 4, and alternate embodiment of the CVD device of this invention is shown. The vacuum chamber 80 is defined by the domed housing 82 and flat base 84, preferably made of quartz, silicon or similar inert material transparent to radiation. Heating elements 86 are coiled around the outer surface of domed housing 82. Radiant heating lamps 88 which can be tungsten filament lamps or halogen lamps with parabolic reflectors, for example, are positioned below the base 84 and oriented to direct radiation toward the reaction chamber 96. The heating elements 86 and heating lamps 88 are spaced to provide controlled temperature conditions in the reaction chamber 96, it being substantially surrounded by radiant heating sources. Insulating material 90 fills the space between the domed housing 82 and upper casing 92.

The inner deposition reaction chamber 96 is defined by the reaction chamber wall 98 which is positioned atop the gas collector 102. Substrate support rods 104 which are fused to the gas collector 102 support the boats 106 in which the substrates 108 are supported in a vertical orientation. The gas distributor 110 is supplied by gas from the reactant gas conduit 112. The gas distribution system enters the vacuum chamber through the gas system casing 114 which is a part of or fused to base 84.

Purging gas inlet 116 is positioned in the annular flange assembly 118. The domed housing 82 and base 84 are held together in sealing engagement by the connecting flange ring assembly 118. Cooling fluid is circulated through the annular flange components by way of appropriate inlets and outlets (not shown) in the manner shown in FIGS. 2 and 3. The cooling system protects the seals from thermal damage.

Figure 5:
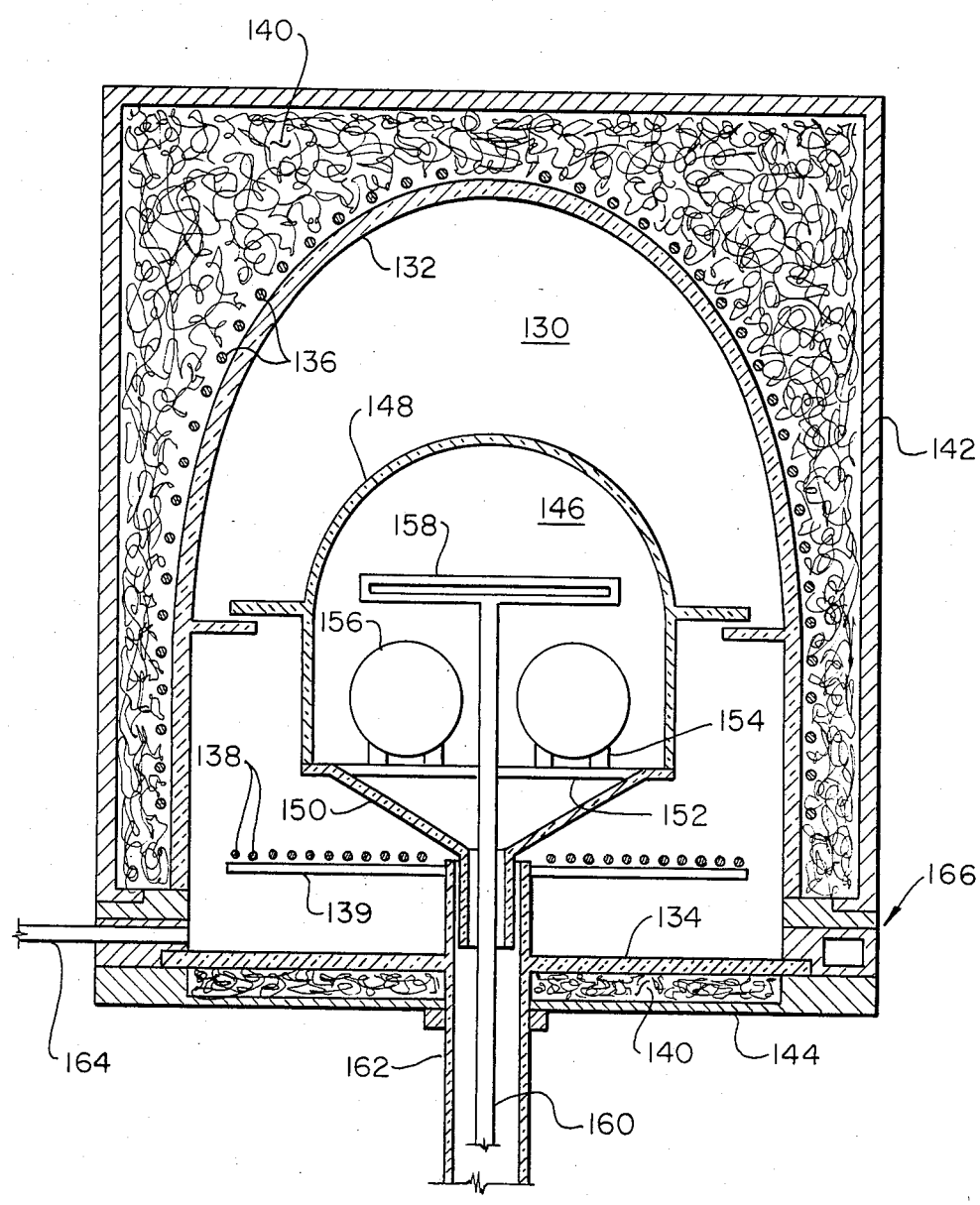
FIG. 5 is a still further embodiment of the CVD device of this invention having a radiant heat source positioned within the vacuum chamber between the base and the reaction chamber.

Referring to FIG. 5, a still further embodiment of this invention is shown. The vacuum chamber 130 is defined by domed housing 132 and base 134. The domed housing 132 and base 134 are preferably made from quartz, silicon or other inert or compatible material. Heating elements 136 are coiled on the outside of the domed housing 132. Heating elements 138 are sealed in quartz to isolate the elements and can be sealed in coiled quartz tubing or sealed between two fused quartz plates, for example. These are suitably connected by protected wiring (not shown) to an electric power source. Heating elements 138 are supported by plate 139. The heat sources 136 and 138 are spaced to provide controlled temperature conditions within reaction chamber 146. Insulating material 140 fills the space between the domed housing 132 and the outer casing 142 and between base 134 and the outer base casing 144.

The inner deposition reaction chamber 146 is defined by the domed reaction chamber wall 148 and the gas collector 150. The substrate support rods 152 support boats 154 which hold the substrates 156 in a vertical orientation. These components are preferably made of quartz. The reaction gas distributor 158 is supplied with reactant gases through conduit 160, the gas transport being contained within casing 162.

Purging gas inlet 164 provides the purging gas as previously described. The connecting annular flange ring assembly 166 provides sealing engagement between the upper and lower components of the vacuum chamber. The connecting flange ring assembly 166 is provided with the coolant inlets and outlets (not shown) which protect the seals in the manner described with respect to FIGS. 2 and 3.

Figure 6:
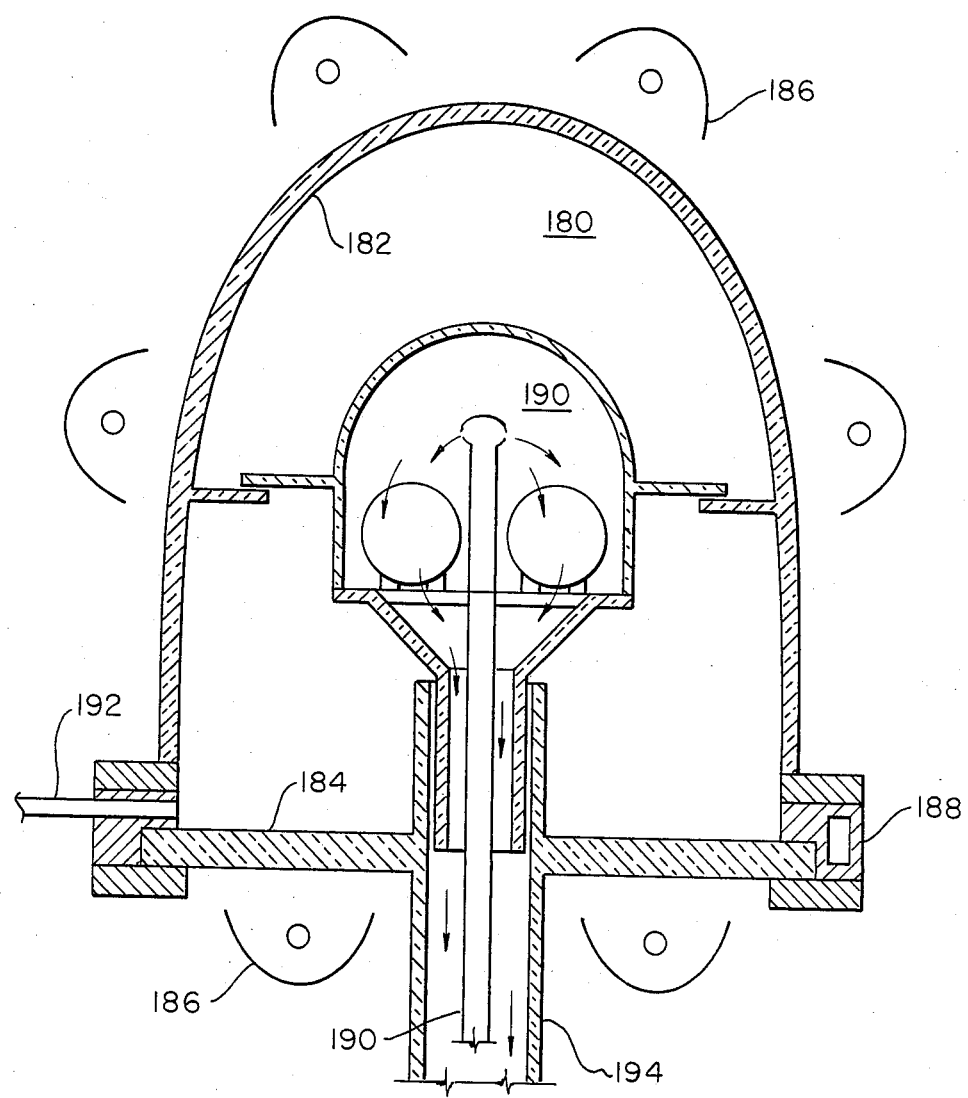
FIG. 6 is a cross-sectional view of another embodiment of this invention including radiant heat lamp sources.

Referring to FIG. 6, a cross-sectional view of a still further embodiment of this invention including radiant heat lamps is shown. The vacuum chamber 180 is defined by the domed upper housing 182 and a base 184. Radiant heaters 186 are spaced evenly around the housing 182 and under the base 184. Two of the four quadrients are shown. The radiant heaters 186 are spaced and oriented to provide precisely controlled temperatures in the reaction chamber 186. The flanged ring assembly 188 provides a sealing engagement between the domed housing 182 and base 184. Purging gas inlet 192 and cooling fluid inlets and outlets (not shown) are provided as described in FIGS. 2 and 3.

The inner deposition reaction chamber 186 and the associated elements shown in FIG. 6 have the construction described with respect to the embodiment of FIG. 1, for example. Similarly the gas distribution casing 194 houses the reaction gas inlet conduit 190 and constitutes the gas outlet as previously described.

Figure 7:
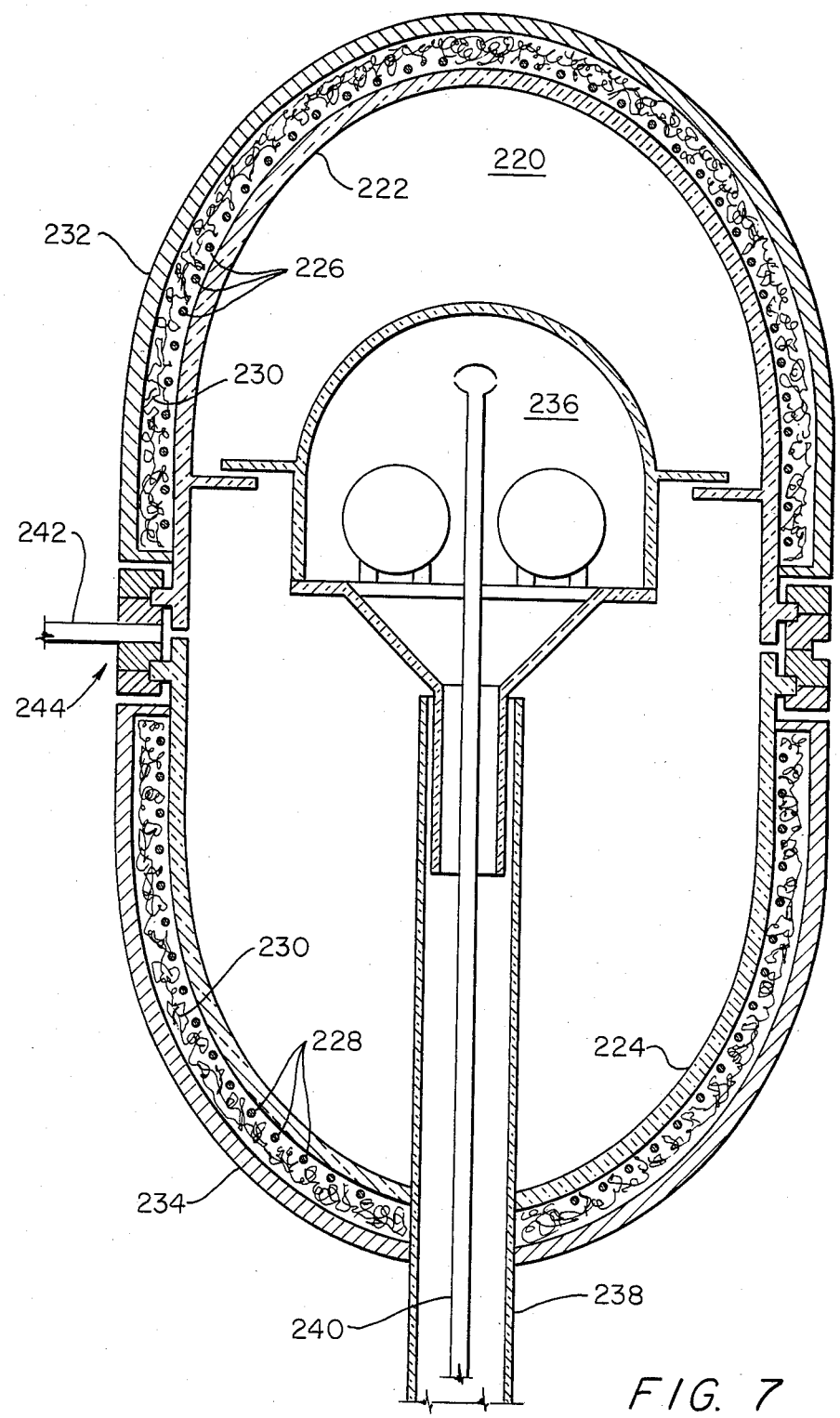
FIG. 7 is a still further embodiment of the CVD device of this invention having a domed upper housing and base construction.

FIG. 7 is a cross-sectional view of a still further embodiment of the CVD device of this invention. Vacuum chamber 220 is defined by the domed housing 222 and domed base 224. Heating elements 226 and 228 are coiled in a configuration about the outer surfaces of the respective domed housing 222 and domed base 224 which provides precise temperature control in the reaction chamber 236. Insulating material 230 is held in place between the domed housing 222 and corresponding outer domed casing 232 and between the domed base 224 and the respective outer base casing 234.

The inner deposition reaction chamber 236 has the configuration and function of those previously described. The gas distribution casing 238 extends through the dome base and is in a sealed engagement therewith. Reactant gas conduit 240 extends through this casing 238. Purging gas inlet conduit 242 provides purging gas as previously described. The annular connecting flange ring assembly 244, and the purging gas inlet, cooling fluid inlets and the seals associated therewith are shown in FIG. 8.

Figure 8:
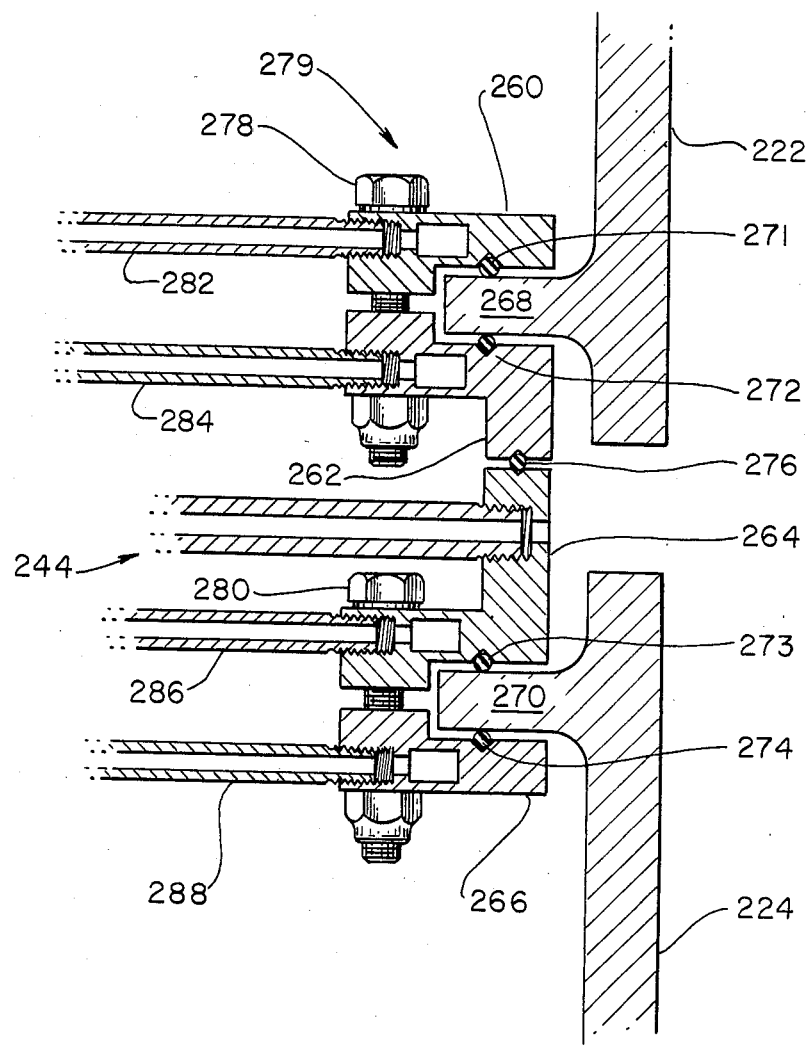
FIG. 8 is a partial cross-sectional view of the detailed flange construction of the device shown in FIG. 7.

Referring to FIG. 8, a partial cross-sectional view of the connecting flange ring assembly 244 of FIG. 7 is shown. The upper flange ring top segment 260 has a gasket 271 such as an O-ring between it and the housing flange 268. The upper flange ring bottom segment 262 has seal 272 between it and the housing flange 268. When the top segment 260 and bottom segment 262 are pressed together by bolt 278, seal 272 is compressed, providing a vacuum seal between these components. In a similar manner, the lower flange ring top segment 264 has a seal 273 between it and the domed base flange 270. The lower flange ring bottom segment 266 has a gasket 274 between it and the domed base flange 270. When under compression from bolt 280, the top and bottom segments of the lower flange ring are pressed together. This places the seal 273 under compression, seal 273 providing a vacuum seal between the opposed surfaces. Another seal 276 is positioned between the upper flange ring bottom segment 262 and the lower flange ring top segment 264. The seals can be elastomeric O-rings or metal seals having one of a variety of configurations including X, E, D and round shapes, for example. When placed under compression by the weight of the upper housing 279 and air pressure (when evacuating the chamber 220), seal 276 provides a vacuum seal. The flange rings are provided with coolant inlets 282, 284, 286 and 288. The cooling fluid circulates throughout the flange elements, maintaining them at the temperature required to protect the various seals and gaskets from overheating.

The CVD apparatus of this invention provides a number of advantages over previously known systems. Floor space requirements are reduced by 85 percent, a typical unit occupying no more than 15 square feet. Elimination of the long cylindrical chambers of converted doping ovens has also simplified the unloading, reloading operation. The convenient disassembly procedure permits rapid reloading with a minimum of heat loss, substantially reducing the cycle time. Fouled reactor components can be replaced for cleaning during a standard reloading cycle, and a highly clean, debris-free deposition environment can be maintained.

The reactor environment obtained with the apparatus of this invention is unequaled in the prior art systems. For example, at 300° C., temperature equilibrium is substantially achieved within 20 minutes of vessel closure as compared with 70 minutes for standard hot wall units. After 30 minutes, the temperature variation within the reactor chamber is less than 2° C. (for isothermal conditions or less than 2° C. from the desired gradient when a temperature gradient is desired.) This is far better than prior art hot wall ovens which after 90 minutes have greater than 4° C. variations. The power efficiency of the systems of this invention is increased almost ten times. At 300° C., prior art systems typically have an sustaining operating power requirement exceeding 2000 watts per unit. The CVD device of this invention has a sustaining power requirement as low as 200 watts.

The invention claimed is:

1. A controlled temperature deposition device comprising radiant heating means substantially surrounding an inner deposition reaction chamber for providing precisely controlled, isothermal temperature conditions therein, the inner deposition reaction chamber having gas distribution means for introducing gas into the inner deposition reaction chamber and removing gas therefrom, and vacuum chamber means surrounding the inner deposition reaction chamber and spaced from the walls thereof for maintaining a medium vacuum therein, the inner deposition reaction chamber being defined by inner walls means spaced apart from said vacuum chamber means for containing the reaction gases within the inner deposition reaction chamber.

2. The chemical vapor deposition device of claim 1 wherein the vacuum chamber means comprises a domed housing and a base cooperating therewith, the material of domed housing and base being substantially transparent to radiation, said radiant heating means being positioned over the outer surface of the domed housing and base for providing precisely controlled temperatures in the reaction chamber.

3. The chemical vapor deposition device of claim 2 wherein the base includes a domed wall portion.

4. The chemical vapor deposition device of claim 1 wherein the vacuum chamber means comprises a domed housing and a base cooperating therewith, the material of domed housing and base being substantially transparent to radiation, said radiant heating means being positioned over the outer surface of the domed housing and between the base and the reaction chamber for providing precisely controlled temperatures in the reaction chamber.

5. The chemical vapor deposition device of claim 1 wherein the gas distribution means includes a gas distributor and a gas collector on opposite sides of a substrate coating zone for receiving substrates.

6. The chemical vapor deposition device of claim 5 wherein the gas distributor and gas collector constitute means for directing reactant gases in a single pass parallel to the substrate surface of vertically oriented substrates, whereby change in reactant gas composition is minimized.

7. The chemical vapor deposition device of claim 2 including sealing means associated with the housing and the base for effecting a vacuum seal therebetween, and the sealing means have circulating fluid cooling means for preventing thermal damage to the seals.

8. The chemical vapor deposition device of claim 5 wherein the gas distributor is positioned above a substrate coating zone, and the gas collector is positioned below a substrate coating zone.

9. The chemical vapor deposition devide of claim 8 wherein the substrate coating zone includes a boat support means for supporting a wafer boat containing wafers in a vertical orientation, whereby gas from the gas distributor flows in a single pass parallel to the substrate surface of vertically oriented substrates to the gas collector and change in the reactant gas composition during coating is minimized.

10. A controlled temperature deposition device comprising radiant heating means substantially surrounding an inner deposition chamber for providing precisely controlled temperature conditions therein, the inner deposition reaction chamber having gas distribution means for introducing gas into the inner chamber and removing gas therefrom, and vacuum chamber means surrounding the inner deposition reaction chamber and spaced from the walls thereof for maintaining a medium vacuum therein, the inner deposition reaction chamber being defined by inner walls spaced apart from said vacuum chamber means, the inner walls being of a material substantially transparent to radiation, and a positive purging gas pressure means positioned between the vacuum chamber and the inner walls for preventing escape of gaseous components from the inner chamber.

11. A controlled temperature deposition device comprising an inner deposition reaction chamber means for containing reaction gases, radiant heating means substantially surrounding the inner deposition reaction chamber means for providing precisely controlled, isothermal temperature conditions therein, the inner deposition reaction chamber having gas distribution means for introducing gas into the inner deposition reaction chamber and removing gas therefrom, and vacuum chamber means surrounding the inner deposition reaction chamber and spaced from the walls thereof for maintaining a medium vacuum therein, the vacuum chamber means comprising a domed housing and a base cooperating therewith, the material of the domed housing and base being substantially transparent to radiation, said radiant heating means being positioned over the outer surface of the domed housing and base for providing precisely controlled temperatures in the reaction chamber, the housing and the base having sealing means associated therewith for effecting a vacuum seal therebetween, the sealing means having circulating fluid cooling means for preventing thermal damage to the seals thereof.

* * * * *